United States Patent [19]
Murphy et al.

[11] Patent Number: 5,138,256
[45] Date of Patent: Aug. 11, 1992

[54] METHOD AND APPARATUS FOR DETERMINING THE THICKNESS OF AN INTERFACIAL POLYSILICON/SILICON OXIDE FILM

[75] Inventors: Richard J. Murphy, Hopewell Junction; Jerome D. Schick, LaGrangeville; Howard R. Wilson, Poughkeepsie, all of N.Y.

[73] Assignee: International Business Machines Corp., Armonk, N.Y.

[21] Appl. No.: 690,405

[22] Filed: Apr. 23, 1991

[51] Int. Cl.⁵ .................... G01R 31/26; G01N 23/00
[52] U.S. Cl. ........................ 324/158 D; 324/71.3; 324/73.1; 324/158 R; 324/537; 437/8; 250/310
[58] Field of Search ........... 324/158 R, 158 D, 158 T, 324/71.3, 73.1, 719, 537, 500; 250/310, 311, 492.2; 356/237; 136/290; 307/311; 437/8

[56] References Cited
U.S. PATENT DOCUMENTS

| | | | |
|---|---|---|---|
| 3,919,639 | 11/1975 | Graff et al. | 324/158 D |
| 4,296,372 | 10/1981 | Feuerbaum | 324/71 EB |
| 4,431,460 | 2/1984 | Barson et al. | 148/1.5 |
| 4,464,627 | 8/1984 | Munakata et al. | 324/158 R |
| 4,467,519 | 8/1984 | Glang et al. | 29/576 B |
| 4,483,726 | 11/1984 | Isaac et al. | 148/187 |
| 4,598,249 | 7/1986 | Goodman et al. | 324/158 R |
| 4,609,867 | 9/1986 | Schink | 324/158 D |
| 4,695,794 | 9/1987 | Bargett et al. | 324/158 D |
| 4,709,141 | 11/1987 | Olsen | 324/158 D |
| 4,859,939 | 8/1989 | Gittleman et al. | 324/158 R |
| 4,956,603 | 9/1990 | Russo | 324/158 T |

*Primary Examiner*—Vinh Nguyen
*Attorney, Agent, or Firm*—Jeffrey L. Brandt; Harold Huberfeld; H. Daniel Schnurmann

[57] ABSTRACT

A method and apparatus for determining the thickness of an interfacial oxide film intermediate to a polysilicon layer of a first conductivity type and a silicon substrate of a second conductivity type supporting a p-n junction. Radiant energy, preferably in the form of light, is directed on to the top surface of the polysilicon layer thereby stimulating carriers which concentrate at the interfacial oxide film, allowing the excited carriers to diffuse across the oxide film, and creating a short circuit, the magnitude of which is inversely related to the thickness of the interfacial oxide film.

15 Claims, 2 Drawing Sheets

METHOD AND APPARATUS FOR DETERMINING THE THICKNESS OF AN INTERFACIAL POLYSILICON/SILICON OXIDE FILM

FIELD OF THE INVENTION

The present invention relates generally to determining a thickness, and more specifically to a method and apparatus for determining the thickness of an interfacial film intermediate to a polysilicon layer and a silicon substrate supporting a p-n junction proximate the film, by stimulating carriers in the polysilicon layer and measuring the short circuit current across the p-n junction.

BACKGROUND OF THE INVENTION

It is well known in the art that in NPN transistors where polycrystalline silicon (polysilicon) is used as the emitter contact to a monocrystalline silicon substrate, a very thin film is formed at the interface between the polysilicon and the silicon substrate, usually in the form of a contaminated thin oxide layer, which layer can critically affect the operation of the transistor and impact its current gain. Such structures are shown, for example, in U.S. Pat. Nos. 4,483,726 to Isaac et al., 4,431,460 to Barson et al., and 4,467,519 to Glang et al., each of which is assigned to the assignee of the present invention. It is therefore important to detect the presence and thickness of this oxide film so as to predict and/or control the performance of the transistor.

In order to measure the presence of this oxide film and thereby obtain a correlation between the current gain of the transistor and the thickness of the interfacial film, Secondary Mass Spectroscopy (SIMS) analyses are routinely performed. In a SIMS analysis, the sample is sputtered away with an ion-gun and the departing materials are analyzed in a mass spectrometer. The lateral area, otherwise called sputtering front, can be as large as 100 microns$^2$. The thickness of the film, on the other hand, can be so thin that its presence is measured at approximately 2 to $3 \times 10^{15}$ atoms/cm$^2$, and determined only by suitably integrating the area under the SIMS curve that is associated with the sputtering of the oxygen.

Measuring an interfacial oxide layer, whether by determining its thickness or by finding the oxygen concentration, is an important requirement in the early stages of a processing cycle to avoid manufacturing a transistor that does not incorporate an appropriate interfacial film. Currently, the SIMS analysis is routinely performed on a wafer immediately after deposition of the emitter polysilicon, usually on a control wafer.

A method for measuring electrical potentials in solid state matter, and more particularly, when the solid state matter is hidden beneath at least one conductor and one insulator layer, has been described in U.S. Pat. No. 4,609,867 to Helmut Schink. In Schink, an electron beam induced current related to a potential drop across an oxide layer is determined. Carriers are excited within the oxide layer allowing the excitation volume to create a conductive path, and measurement of this current can be used to determine the potential. This technique is effective for thick oxide layers on the order of approximately 1000 A, but is inadequate for measurements of the thickness of the oxide film at a silicon/polysilicon interface, which is usually on the order of a few Angstroms.

A similar approach is described in U.S. Pat. No. 4,296,372 to Hans-Peter Feuerbaum, wherein a voltage is applied to a conductive layer through the insulating material which extends over a conductive region to be tested. A voltage measurement taken at that region provides a good indicator of the electrical integrity of the tested region underneath. The same disadvantage found in Schink's teaching applies to this teaching, where no information regarding the thickness of the insulating film is provided.

Measurement of surface photovoltages with back surface illumination and without making ohmic contact has been advantageously used in silicon-on-saphire (SOS) structures, providing a non-destructive testing of SOS wafers. This technique is described in U.S. Pat. No. 4,859,939 to Jonathan I. Gittelman, et al. This method uses a light source to provide radiant energy to the device under test. Gittelman, et al., however, does not show or suggest its use for measuring the thickness of oxide films in polysilicon/silicon structures. Rather, Gittelman et al. obtains a measurement of the quality of the semiconductor film by determining the lifetime of the carriers that are generated.

In summary, no non-destructive system is known which is sufficiently sensitive to determine the thickness of a polysilicon/silicon interfacial oxide film in the Angstrom range.

OBJECTS OF THE INVENTION

Accordingly, it is an object of the present invention to provide a method and apparatus for determining the thickness of a polysilicon/silicon interfacial film.

It is another object of the invention to provide non-destructive means for determining the thickness of a thin film of oxide in the Angstrom range, and at the p-n junction of a transistor, thereby gaining an improved understanding of certain operational characteristics of the transistor, particularly during early stages of fabricating the transistor.

It is a further object of the invention to provide a method for determining the thickness of an oxide layer that extends over a very small area (e.g., over a single transistor emitter area).

SUMMARY OF THE INVENTION

The aforementioned objects are achieved according to a first aspect of the present invention by an apparatus that determines the thickness of an interfacial oxide film intermediate to a silicon region and a layer of polysilicon, the silicon region being of a first conductivity type and the polysilicon layer of second conductivity type, the silicon region including a first-second conductivity type junction proximate the oxide film, the apparatus including: means for stimulating carriers in the polysilicon layer to excite carriers to diffuse across the interfacial film so as to generate a short circuit current across the first-second conductivity type junction and, means for measuring the short circuit current, the magnitude of the short circuit being related to the thickness of the interfacial oxide film.

In accordance with another aspect of the present invention, there is provided a method for determining the thickness of an interfacial film intermediate to a silicon region and a layer of polysilicon, said silicon region of a first conductive type, said polysilicon of a second conductivity type, said silicon region including a first-second conductivity type junction proximate said interfacial film, said method comprising the steps of stimulating carriers in the polysilicon layer to excite carriers to diffuse across said interfacial layer, so as to generate a short circuit current across said first-second conductivity type junction; and measuring said short circuit current, the magnitude of said short circuit current being related to the thickness of said interfacial film.

BRIEF DESCRIPTION OF THE DRAWINGS

Other objects, features and advantages of the present invention will become more fully apparent from a consideration of the following detailed description of the preferred embodiment, and accompanying drawing Figures in which.

DESCRIPTION OF THE PREFERRED EMBODIMENT

Reviewing first some pertinent semiconductor physics relationships, the equation that describes the short circuit current $I_{sc}$ of a solar cell comprising a p-n junction is:

$$I_{sc} = qAG_{op}(L_p + L_n),$$

where q is the electronic charge, A the generation area, $G_{op}$ the generation rate, and $L_p$ and $L_n$, the minority carrier diffusion lengths of holes and electrons, respectively. If the generation of minority carriers is contained on one side of the junction, e.g., on the n-type side, the equation becomes:

$$I_{sc} = qAG_{op}L_p.$$

A relative comparison of hole diffusion lengths for different devices can be obtained from Isc measurements on these devices using identical generation conditions. If a p-n junction is contacted on the n-side by n-type polysilicon that includes a thin interfacial film, the present inventors have determined that the measured diffusion length $L_p'$ will be altered by the presence of this film. They have further discovered that, with two devices differing only in the thickness of their interfacial film, under identical generation conditions, their short-circuit currents will vary in direct correspondence to the thickness of their interfacial films. This relation holds true for thickness ranges where a transistor current gain varies with film thickness or with oxygen concentrations as measured by SIMS at the polysilicon-emitter-base interface. This interfacial film will henceforth, also be referred to as interfacial oxygen layer and oxide layer.

Figure 1:
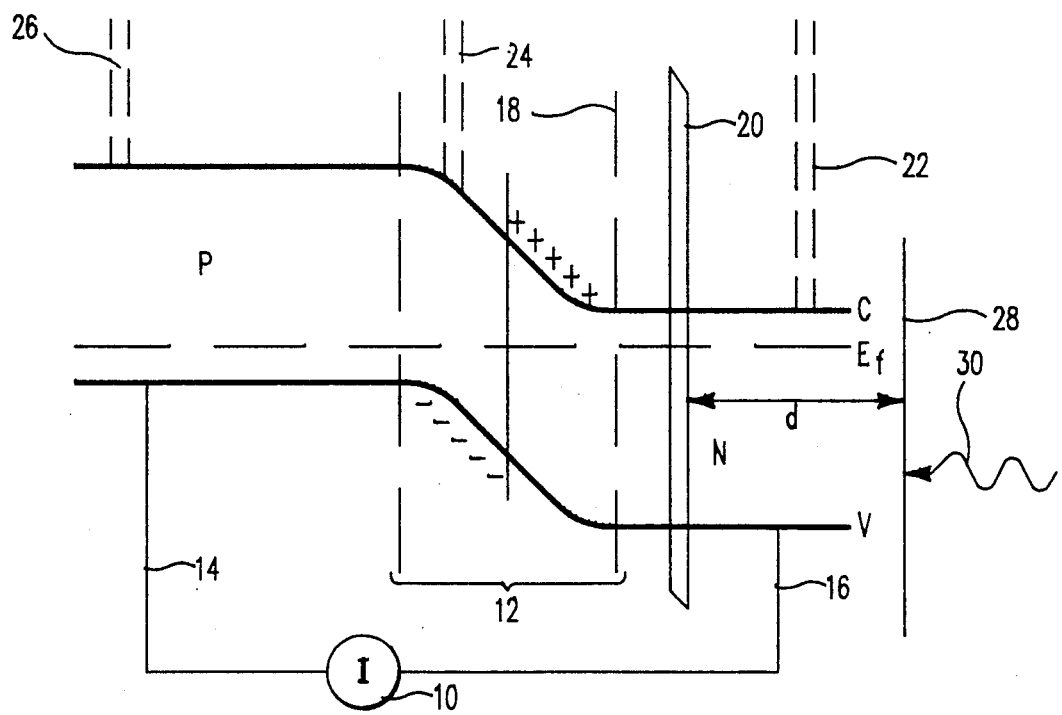
FIG. 1 is a pictorial representation of the energy levels associated with a semiconductor structure including a p-n junction in the presence of a thin film of oxide, and means for measuring the space charge distribution after impinging light on the semiconductor structure.
Figure 2:
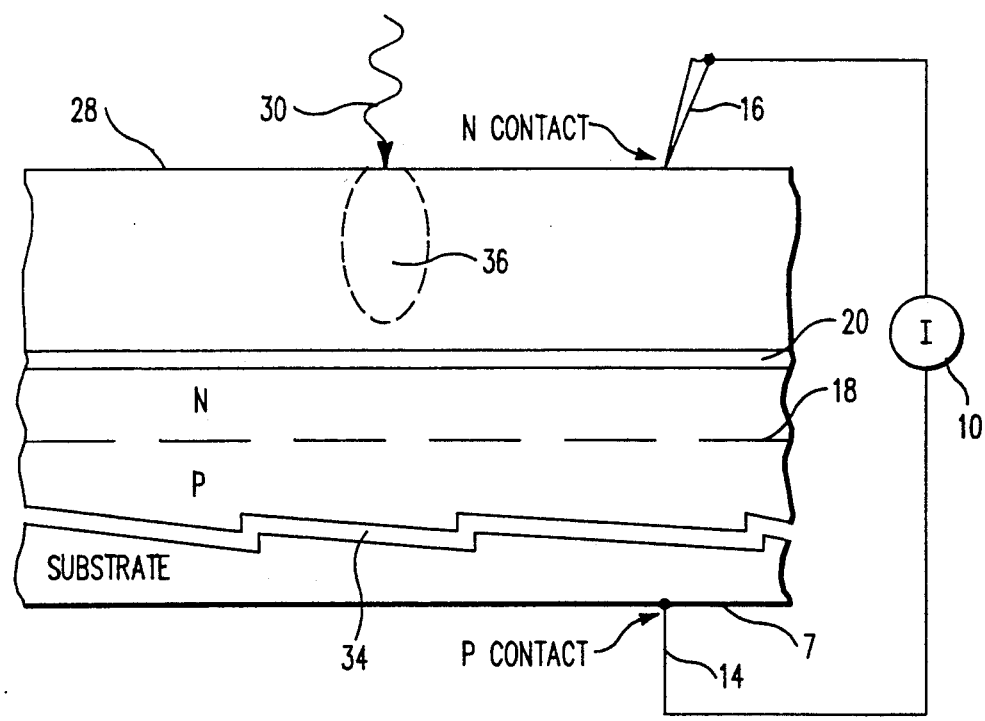
FIG. 2 is a front view of the polysilicon/silicon semiconductor structure shown in FIG. 1, including the interfacial oxide film, and an electrical circuit for measuring the short circuit current across the oxide film generated as a result of exciting carriers within the polysilicon layer.

Referring now to FIGS. 1 and 2, FIG. 1 shows a pictorial view of energy bands associated with a semiconductor structure supporting a p-n junction, while FIG. 2 is a front view of this same structure. For purposes of explaining the present invention, it will be discussed first with respect to FIG. 1.

Referring now to FIG. 1, there is illustrated the various energy bands associated with a p-n junction 18 established proximate a thin interfacial oxide film 20.

A current measuring device 10 with low input impedance is shown with its input terminals 14 and 16, respectively, attached to the p and n sides of p-n junction 18. The band model diagram with a conduction band C, valence band V, and Fermi level EF define the depletion layer or space charge region 12 that results from the formation of a p-n junction in the semiconductor material.

When electron-hole pairs are created by irradiation at selected points of the semiconductor structure, and more particularly at points 22 and 26, under unbiased conditions, these carriers diffuse throughout their respective semiconductor materials until they recombine at some defect site. This physical phenomena, well known to those skilled in the art, is of no consequence to the electrical properties of the overall circuit. The same electron-hole pairs created by irradiation at location 24 within space charge region 12 will, however, be influenced by the presence of an electric field which will sweep these pairs out of the space charge region. This gives rise to a distinct external current, referred to as short circuit current, and whose magnitude is measured by the current measuring device 10. As the irradiation at location 26 approaches the space charge region 12, there is a point near the space charge region at which some of the carriers that are generated will diffuse into the space charge region, thereby contributing to the short circuit current. It is evident that maximum current will be attained when the irradiation actually impinges the space charge region, and in particular, the region where the electric field is the greatest.

In accordance with the present invention, irradiation 30 is provided, for example by a source of light with adequate energy photons or by means of an electron beam with suitable energy, into the N semiconductor region. Thin-film oxide 20 is shown incorporated in an n-region 28 of the band model diagram near p-n junction 18. It is essential that this oxide layer be very thin so as not to affect the energy level model in an appreciable manner.

Photo-excitation is provided by having light 30 impinge on the n-region 28 such that no carriers are excited farther into the n-type semiconductor material than the distance d, the distance from the n-type surface 28 to the interfacial layer 20. Carriers thus excited within the diffusion length of space charge region 12 on the n-type side of junction 18 must diffuse through the thin oxide film 20 to reach the space charge region 12 and contribute to the short circuit current measured by ammeter 10.

The present inventors have discovered that when carriers are excited in a region that is separated from the p-n junction by a thin interfacial oxide layer, the magnitude of the measured short circuit current is inversely related to the thickness (or to the oxygen concentration) of the interface oxide through which the generated carriers must diffuse in order to reach the space charge region 12. In a high performance NPN transistor, a thin oxide interfacial film between the emitter polysilicon and the single crystal silicon substrate shows an increase in current gain with thickness of the interfacial oxide layer over a narrow range which must be controlled.

FIG. 2 is a block view of the structure illustrated in FIG. 1 including n-type polysilicon 28 on the p-type single crystal silicon 34 incorporating an interfacial thin-film of oxide 20 and a p-n junction 18 in the substrate proximate the thin-film. A photon source irradiates the polysilicon with photons 30 of suitable energy, and such that they do not penetrate into the polysilicon deeper than the oxide layer 20. The photons thus form an excitation volume 36 in which free carriers are generated.

The current measuring apparatus 10 is a low input-impedance anmeter device such that the short-circuit current can be measured by connecting terminal 16 to the n-side of the structure and terminal 14 at the p-side. The carriers generated in the excitation volume 36 are allowed to diffuse throughout the polysilicon. Those carriers, which diffuse through the oxide layer, reach the p-n junction 18 and contribute to the short circuit current.

The structure as described could equivalently be comprised of a p-type semiconductor material on top of a predominantly n-type substrate incorporating an interfacial oxide thin film and a p-n junction beneath the oxide in the predominantly n-type material. The irradiation would then be performed in the p-type region above the interfacial oxide layer and the current measured using an arrangement identical to the one previously described. In a manner well known in the art, substrate 34 could additionally comprise a region of an epitaxial layer formed over an underlying monocrystalline substrate.

In accordance with the present invention, the structures of FIGS. 1 and 2 are initially measured for oxide content in the usual manner using routine SIMS techniques. A calibration curve is then constructed in which SIMS results of several such samples with varying oxide concentrations are measured. These samples are considered the standards, and appropriate short circuit current measurements are conducted on the same samples, as illustrated in FIG. 2. The measurements preferably utilize a wafer holder such that electric contact 14 is made to the p-side of the wafer. A probe contact 16 is then brought down on top of the surface of the polysilicon, thus connecting the current measuring instrument 10. Suitable illumination is directed to the top of the surface of the polysilicon in proximity to the probe contact, but carefully avoiding illuminating the contact region itself. Appropriate photon energy and intensity are selected and the short circuit current measurement is made for each wafer that was previously analyzed with SIMS. This data is plotted as shown in FIG. 3.

Figure 3:
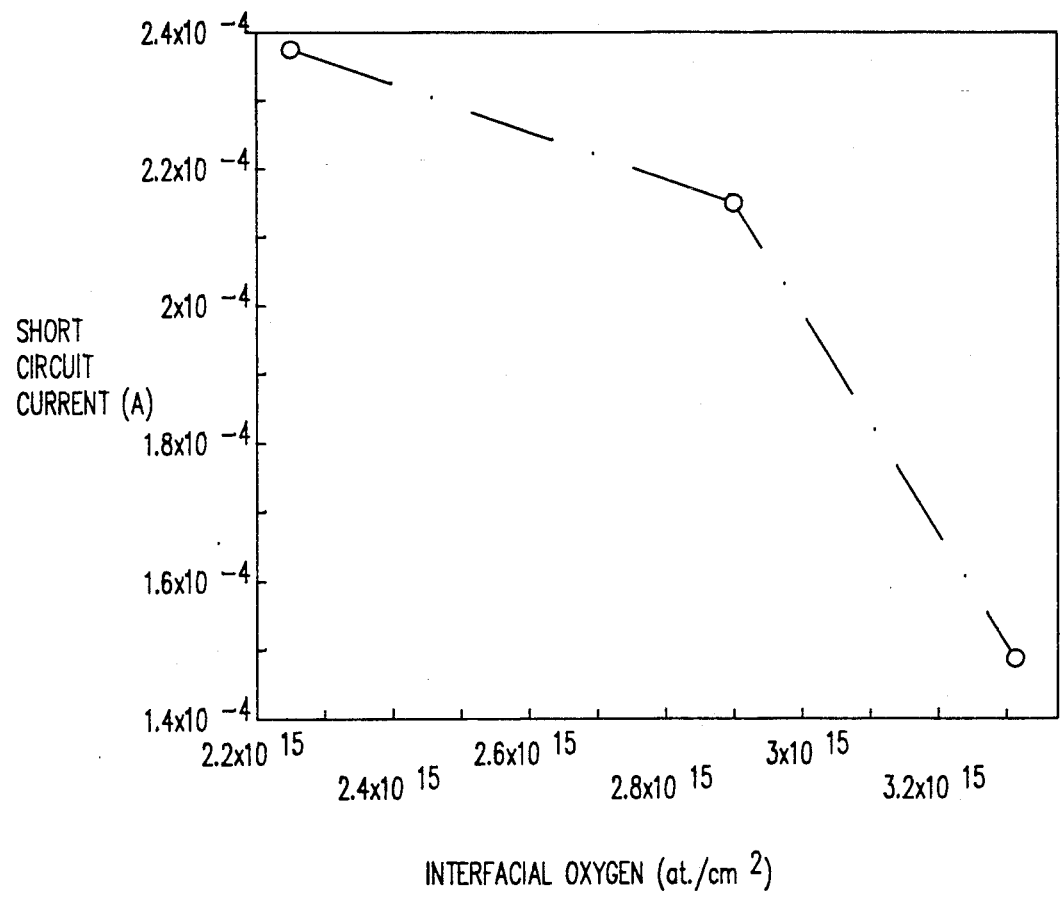
FIG. 3 is a graph illustrating the relationship between the interfacial layer, as measured by SIMS analysis in atoms/cm$^2$, and the short circuit current as measured by the present technique.

FIG. 3 is a plot of the data collected in a typical study of three wafers. Short circuit current in amps. is shown on the vertical axis, while interfacial oxygen, as measured in SIMS analysis, is shown on the horizontal axis. A plot indicates the test points for the above described wafer samples.

With a calibration curve similar to that shown in FIG. 3, an operator initially makes a short circuit current measurement, using the above-described photon simulation process on a wafer of unknown oxide thickness, i.e., of unknown oxygen concentration. By examining the location of the magnitude of the current on the abscissa of the calibration curve, the oxygen concentration, i.e., oxide thickness, can be reliably and accurately determined. Thus, a fast, non-destructive test early in the process cycle, before device parameters are known or available can reliably be obtained. Upon completion of the experiment, transistor parameters, such as current gain can be predicted before completion of the actual device.

The present invention has particular application in measuring the interfacial oxide films in polysilicon emitter transistors of the type shown, for example, in U.S. Pat. Nos. 4,483,726, 4,431,460, and 4,467,519, each of which is incorporated herein by reference. Such measurements can be used to predict and/or control the performance of these high-performance, vertical bipolar transistors.

Although this invention has been disclosed by reference to particular embodiments thereof, many changes and modifications of the invention will become apparent to those skilled in the art without departing from the spirit and scope of the invention.

What is claimed is:

1. A method for determining the thickness of an interfacial film intermediate to a silicon region and a layer of polysilicon, said silicon region including a first layer of a first conductivity type over a second layer of a second conductivity type proximate to said interfacial film, said method comprising the steps of:
   stimulating carriers in the polysilicon layer to excite said carriers to diffuse across said interfacial film, so as to generate a short circuit current across said interfacial film; and
   measuring said short circuit current and determining said film thickness therefrom, the magnitude of said short circuit current being inversely proportional to the thickness of said interfacial film.

2. A method as in claim 1, wherein said polysilicon layer is n-type and said silicon region is predominantly p-type and wherein said silicon region supports a p-n junction proximate to said interfacial film.

3. A method as in claim 2, wherein said interfacial film is an oxide film, and includes contaminant elements which affect the operation of said p-n junction.

4. A method as in claim 2, whereby said p-n junction is the base/emitter junction of an NPN transistor.

5. A method as in claim 1, wherein said stimulating step includes impinging radiant energy into said polysilicon layer above said interfacial film.

6. A method as in claim 1, wherein said polysilicon layer is p-type and said silicon region is predominantly n-type and wherein said silicon region supports a p-n junction proximate to said interfacial film.

7. A method as in claim 1, wherein said silicon region comprises an epitaxial layer formed on an underlying silicon substrate.

8. An apparatus for determining the thickness of an interfacial film intermediate to a silicon region and to a layer of polysilicon, said silicon region of a first conductivity type, said polysilicon of a second conductivity type, said silicon region supporting a first layer of a first conductivity type over a second layer of a second conductivity type proximate to said film, said apparatus comprising:
   means for stimulating carriers in the polysilicon layer to excite said carriers to diffuse across said interfacial film, so as to generate a short circuit current across said interfacial film; and
   means for measuring said short circuit current and determining said film thickness therefrom, the magnitude of said short circuit current being inversely proportional to the thickness of said interfacial film.

9. An apparatus as in claim 8, wherein said polysilicon layer is p-type and said silicon region is predominantly n-type and wherein said silicon region supports a p-n junction proximate to said interfacial film.

10. An apparatus as in claim 9, wherein said p-n junction is the base/emitter junction of a transistor.

11. An apparatus as in claim 8, wherein said means for stimulating carriers includes means for directing radiant energy into said polysilicon layer above said interfacial film.

12. An apparatus as in claim 11, wherein said radiant energy is provided by a light source.

13. An apparatus as in claim 8, wherein said polysilicon layer is p-type and said silicon region is predominantly n-type and wherein said silicon region supports an n-p junction proximate to said interfacial layer.

14. An apparatus as in claim 8, wherein said interfacial film is an oxide film and includes contaminant elements which affect the operation of said p-n junction.

15. An apparatus as in claim 8, wherein said silicon region comprises an epitaxial layer formed on an underlying silicon substrate.

* * * * *